(12) United States Patent
Oshima (10) Patent No.: US 7,278,001 B2
(45) Date of Patent: Oct. 2, 2007

(54) MEMORY CARD, SEMICONDUCTOR DEVICE, AND METHOD OF CONTROLLING SEMICONDUCTOR MEMORY

(75) Inventor: Takashi Oshima, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 11/018,808

(22) Filed: Dec. 22, 2004

(65) Prior Publication Data

US 2005/0268026 A1   Dec. 1, 2005

(30) Foreign Application Priority Data

May 27, 2004   (JP)   ............... 2004-157541

(51) Int. Cl.
  *G06F 12/02*   (2006.01)
  *G11C 16/02*   (2006.01)
(52) U.S. Cl. .................. 711/165; 711/103; 711/203
(58) Field of Classification Search .................. None
   See application file for complete search history.

(56) References Cited

U.S. PATENT DOCUMENTS 6,034,897 A * 3/2000 Estakhri et al. ........ 365/185.33
6,115,785 A * 9/2000 Estakhri et al. ............. 711/103
6,145,051 A   11/2000 Estakhri et al.

FOREIGN PATENT DOCUMENTS

JP   2002-133877   5/2002
KR   2003-0070119   8/2003

OTHER PUBLICATIONS

Imamiya et al., "A 130mm2, 256-Mbit NAND Flash with Shallow Trench Isolation Technology", IEEE Journal of Solid-State Circuits, Nov. 1999, vol. 34, Iss. 11, pp. 1536-1543.*
Ichige et al., "A Novel Self-Aligned Shallow Trench Isolation Cell for 90 nm 4 Gbit NAND Flash EEPROMs", 2003 Symposium on VLSI Technology Digets of Technical Papers, Jun. 2003, IEEE, pp. 89-90.*
U.S. Appl. No. 11/205,125, filed Aug. 17, 2005, Oshima.
U.S. Appl. No. 11/085,530, filed Mar. 22, 2005, Oshima.

* cited by examiner

*Primary Examiner*—Reginald Bragdon
*Assistant Examiner*—Tyler Willhite
(74) *Attorney, Agent, or Firm*—Oblon, Spivak, McClelland, Maier & Neustadt, P.C.

(57) ABSTRACT

A semiconductor device includes a controller which operates if a request is made that data be written in a certain area in a first block in a semiconductor memory having a predetermined erase block size in which data has already been written, to write the data requested to be written, in a leading area in a second block from which data has already been erased, regardless of a value of an address of the certain area.

18 Claims, 9 Drawing Sheets

MEMORY CARD, SEMICONDUCTOR DEVICE, AND METHOD OF CONTROLLING SEMICONDUCTOR MEMORY

CROSS-REFERENCE TO RELATED APPLICATIONS

This application is based upon and claims the benefit of priority from prior Japanese Patent Application No. 2004-157541, filed May 27, 2004, the entire contents of which are incorporated herein by reference.

BACKGROUND OF THE INVENTION

1. Field of the Invention

The present invention relates to a memory card in which a nonvolatile semiconductor memory is mounted, and in particular, to a memory card in which a nonvolatile semiconductor memory having a predetermined erased block size is mounted, as well as a semiconductor device mounted in the card, and a method of controlling the semiconductor memory.

2. Description of the Related Art

A NAND flash memory is often employed as a nonvolatile memory mounted in a memory card. In the NAND flash memory, a specified number of memory cells are grouped into a unit called a page. Further, a specified number of pages are grouped into a unit called a block.

The configuration of the NAND flash memory does not allow data to be simply written in a cell in which data has already been written. Erasure must be carried out in order to write data again. Here, the erasure can be carried out only in blocks. Reads and writes are generally carried out in pages. In particular, for writes, data must be sequentially written starting with a leading page in a physical block.

For example, it is assumed that a controller in a NAND flash memory changes data in a certain area (for example, a page) in a first block in which data has already been written, in response to a write request made by a host apparatus that uses the NAND flash memory. In this case, the controller first searches for a second block from which data has already been erased. Then, the controller sequentially writes (copies), to the second block, data contained in the area from the leading page of the first block to a page immediately before the one to be changed. Subsequently, the controller writes the data from the page to be changed, in the second block. Finally, the controller copies, to the second block, data contained in the area from a page immediately after the one to be changed to the final page.

Jpn. Pat. Appln. KOKAI Publication No. 2002-133877 discloses a NAND EEPROM that enables fast block erasures.

However, with the conventional write method, if a write is executed on a leading page in one block and then on a final page in another block, the time interval between the two writes is longest. In such a case, if the specification of the memory card includes a temporal restriction, the restriction may not be met. As a result, the memory card may malfunction. The above document may involve a similar problem.

It is thus desired to accomplish operations that meet the temporal restriction on writes.

BRIEF SUMMARY OF THE INVENTION

A semiconductor device according to an embodiment of the present invention comprises a controller which operates if a request is made that data be written in a certain area in a first block in a semiconductor memory having a predetermined erase block size in which data has already been written, to write the data requested to be written, in a leading area in a second block from which data has already been erased, regardless of a value of an address of the certain area.

A memory card according to an embodiment of the present invention comprises a nonvolatile semiconductor memory having a predetermined erase block size; and a controller which operates if a request is made that data be written in a certain area in a first block in the nonvolatile semiconductor memory in which data has already been written, to write the data requested to be written, in a leading area in a second block from which data has already been erased, regardless of a value of an address of the certain area.

A method of controlling a semiconductor memory having a predetermined erase block size, according to an embodiment of the present invention, comprises receiving a request that data be written in a certain area in a first block in the semiconductor memory in which data has already been written; and writing the data requested to be written, in a leading area in a second block from which data has already been erased, regardless of a value of an address of the certain area.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments of the present invention will be described below with reference to the drawings.

Figure 1:
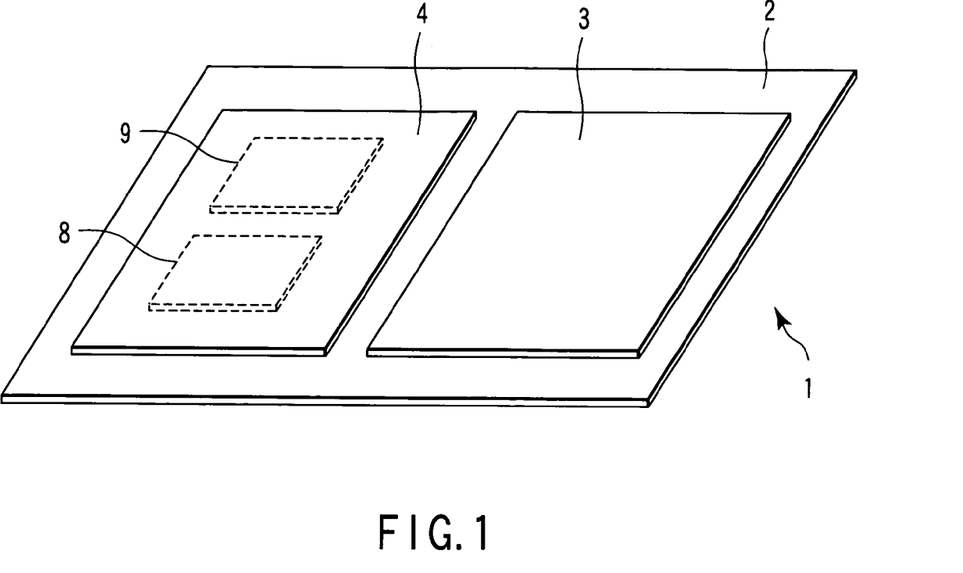
FIG. 1 is a perspective view schematically showing the configuration of a device or the like which is mounted in a memory card according to an embodiment of the present invention.

FIG. 1 is a perspective view schematically showing the configuration of a device or the like which is mounted in a memory card according to an embodiment of the present invention.

As shown in this figure, the memory card 1 according to the present embodiment has a NAND flash memory 3 and a controller 4 arranged on a printed circuit board (PCB) substrate 2. Functional blocks such as a central processing unit (CPU) 8 and a read-only memory (ROM) 9 are mounted in the controller 4. Each of the devices will be described later in detail. The NAND flash memory 3 may be a binary memory in which one-bit information is stored in one memory cell or a multivalued memory in which information containing more than one bit (for example, 2 bits) is stored in one memory cell. FIG. 1 shows that the NAND flash memory 3 and the controller 4 are arranged on the PCB. However, the NAND flash memory 3 and the controller 4 may be arranged on the same large-scale integration (LSI) circuit board.

The terms "logical block address" and "physical block address, as used herein, mean the logical address and physical address, respectively, of a block itself. Further, the "logical address" and "physical address" principally mean the logical address and physical address of a block itself but indicates that they may be addresses corresponding to a resolution unit smaller than the block unit.

Figure 2:
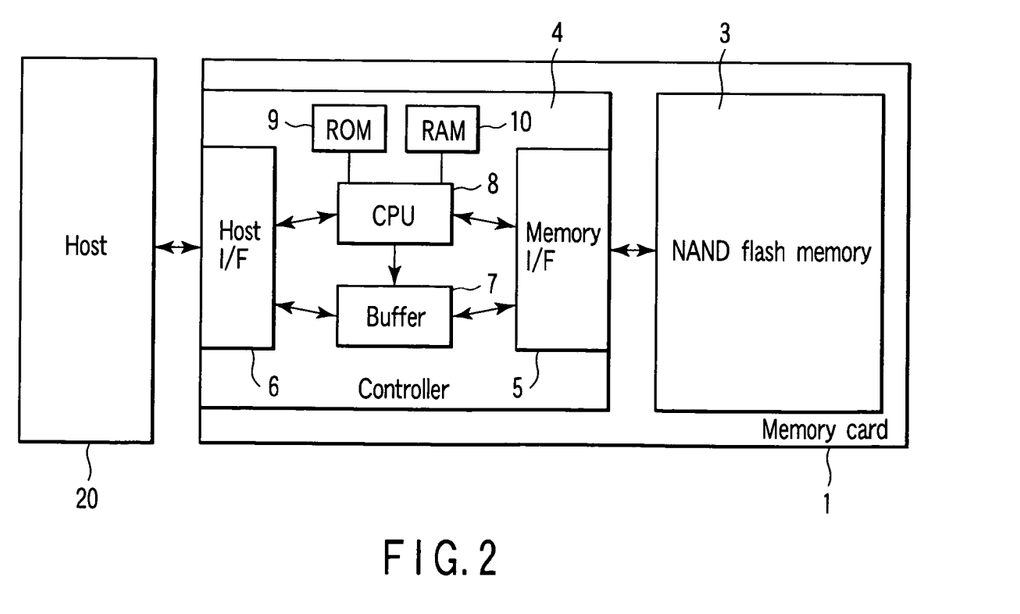
FIG. 2 is a block diagram showing a configuration including a host and the memory card.

FIG. 2 is a block diagram showing a configuration including a host and the memory card. Elements common to FIG. 1 are denoted by the same reference numerals.

A host apparatus (hereinafter referred to as a host) 20 comprises hardware and software (system) required to access a memory card to be connected to the host apparatus. The host 20 is constructed to manage the physical status of the interior of the memory card (which physical block address contains which logical sector address data, or from which block data has already been erased) to directly control the flash memory in the memory card.

Assuming that the NAND flash memory used has an erase block size of 16 Kbytes, the host 20 assigns every 16 Kbytes of logical and physical addresses, and in many cases, sequentially executes write or read accesses on 16 Kbytes of logical addresses (the corresponding commands are issued).

When connected to the host 20, the memory card 1 receives a power supply from the host 20 to operate. The memory card 1 then executes a process corresponding to an access from the host 2. The memory card 1 has the NAND flash memory 3 and the controller 4 as described previously.

The NAND flash memory 3 is a nonvolatile memory for which the erase block size (the block size corresponding to the erase unit) is set at 256 Kbytes. For example, for each write or read, 16 Kbytes of data is written in or read from the NAND flash memory 3. The NAND flash memory 3 is produced using, for example, a 0.09-µm process technique. That is, the design rule for the NAND flash memory 3 is less than 0.1 µm.

Besides the previously described CPU 8 and ROM 9, the controller 4 is provided with a memory interface section 5, a host interface section 6, a buffer 7, and a random access memory (RAM) 10.

The memory interface section 5 executes an interfacing process between the controller 4 and the NAND flash memory 3. The host interface section 6 executes an interfacing process between the controller 4 and the host 20.

When data sent by the host 20 is written in the NAND flash memory 3, the buffer 7 temporarily stores a specified amount of data (for example, one page of data). When data read from the NAND flash memory 3 is transmitted to the host 20, the buffer also temporarily stores a specified amount of data.

The CPU 8 controls operations of the whole memory card 1. When, for example, the memory card 1 receives a power supply, the CPU 8 loads firmware (a control program) stored in the ROM 9 onto the RAM 10 to execute a predetermined process. The CPU 8 thus creates various tables on the RAM 10, accesses a relevant area on the NAND flash memory 3 in response to a write, read, or erase command from the host 20, or controls a data transfer process through the buffer 7.

The ROM 9 is a memory that stores, for example, control programs used by the CPU 8. The RAM 10 is a memory used as a work area for the CPU 8 to store control programs and various tables.

Figure 3:
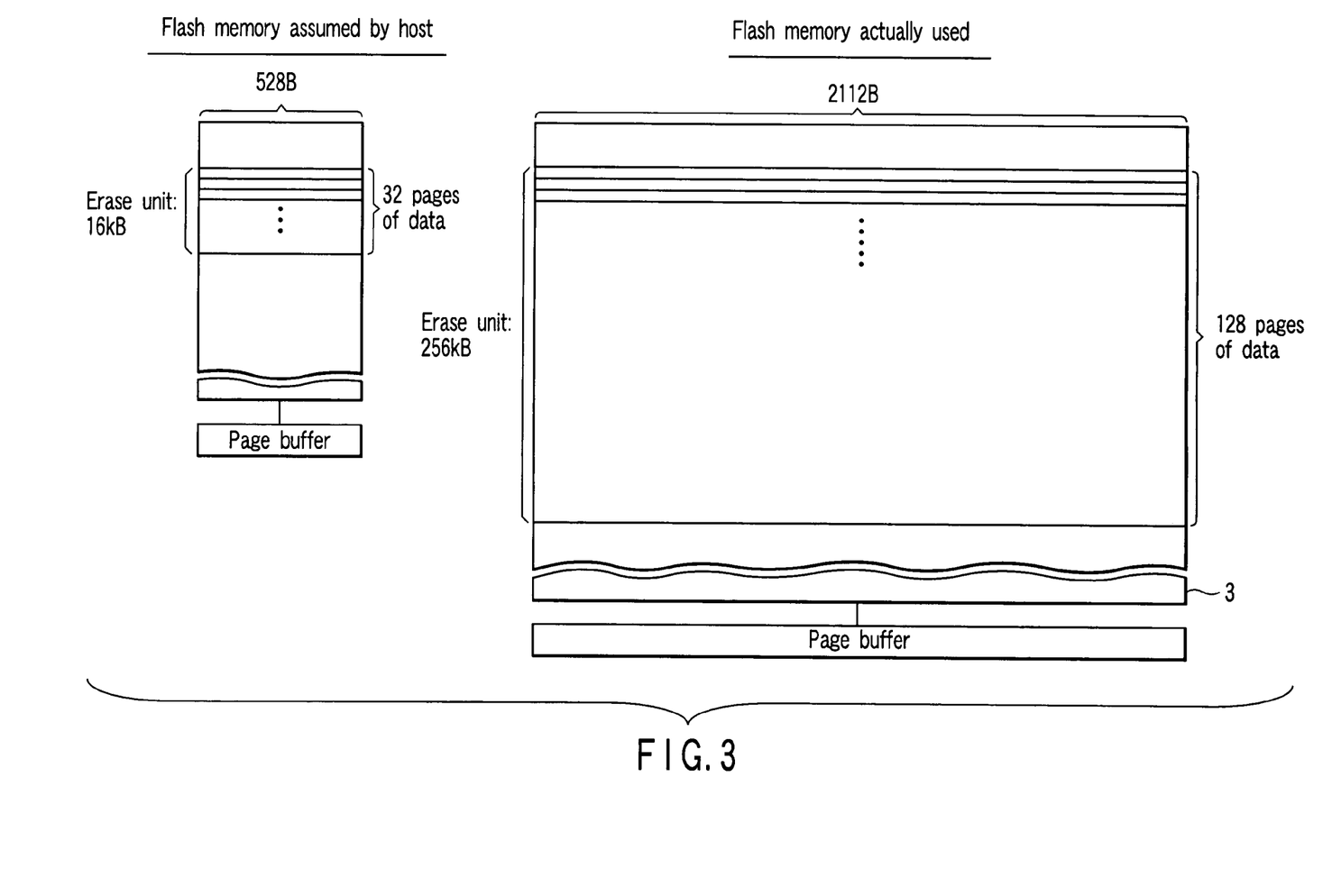
FIG. 3 is a diagram showing a difference in data arrangement between a flash memory assumed by a host system and a flash memory actually used.

FIG. 3 is a diagram showing a difference in data arrangement between a flash memory assumed by the host 20 and the flash memory actually used (that is, the NAND flash memory 3 in the memory card 1).

In the flash memory assumed by the host 20, each page has 528 bytes (512 bytes of data storage section+16 bytes of redundant section), and 32 pages correspond to one erase unit (that is, 16 Kbytes+0.5 Kbytes (in this case, K is 1,024)). A card in which such a flash memory card is mounted will hereinafter sometimes be referred to as a "small block card".

On the other hand, in the flash memory 3 actually used, each page has 2,112 bytes (512 bytes of data storage section×4+10 bytes of redundant section×4+24 bytes of management data storage section), and 128 pages correspond to one erase unit (that is, 256Kbytes+8 Kbytes). A card in which such a flash memory card is mounted may hereinafter be referred to as a "large block card". For convenience, the erase unit for the small block card will hereinafter be referred to as 16 Kbytes. The erase unit for the large block card will hereinafter be referred to as 256 Kbytes.

Each of the flash memory assumed by the host 20 and the flash memory 3 actually used comprises a page buffer required to receive or output data from or to the flash memory. The page buffer provided in the flash memory assumed by the host 20 has a storage capacity of 528 bytes (512 bytes and 16 bytes). On the other hand, the page buffer provided in the flash memory actually used has a storage capacity of 2,112 bytes (2,048 bytes and 64 bytes). For each data write or the like, each page buffer receives or outputs one page of data from or to the flash memory, the page corresponding to its storage capacity.

In the example shown in FIG. 3, the flash memory 3 actually used has an erase block size 16 times as large as that of the flash memory assumed by the host 20. However, the present invention is not limited to this aspect. Another configuration is possible provided that the erase block size of the flash memory 3 actually used is substantially an integral multiple of that of the flash memory assumed by the host 20.

To make the large block card a product that is effective in a practical sense, the flash memory 3, shown in FIG. 3, desirably has a storage capacity of 1 Gbits or more. If the flash memory 3 has a storage memory of, for example, 1 Gbits, there are 512 256-Kbyte blocks (erase unit).

FIG. 3 illustrates that the erase unit is a 256-Kbyte block. However, it is also effective in a practical sense to configure the flash memory so that the erase unit is, for example, 128 Kbytes. In this case, there are 1,024 128-Kbyte blocks.

FIG. 3 also shows that the erase block size of the flash memory 3 actually used is larger than that of the flash memory assumed by the host 20. However, the present invention is not limited to this aspect, the flash memory may be configured so that the flash memory 3 actually used has a smaller erase block size than the flash memory assumed by the host 20.

Figure 4:
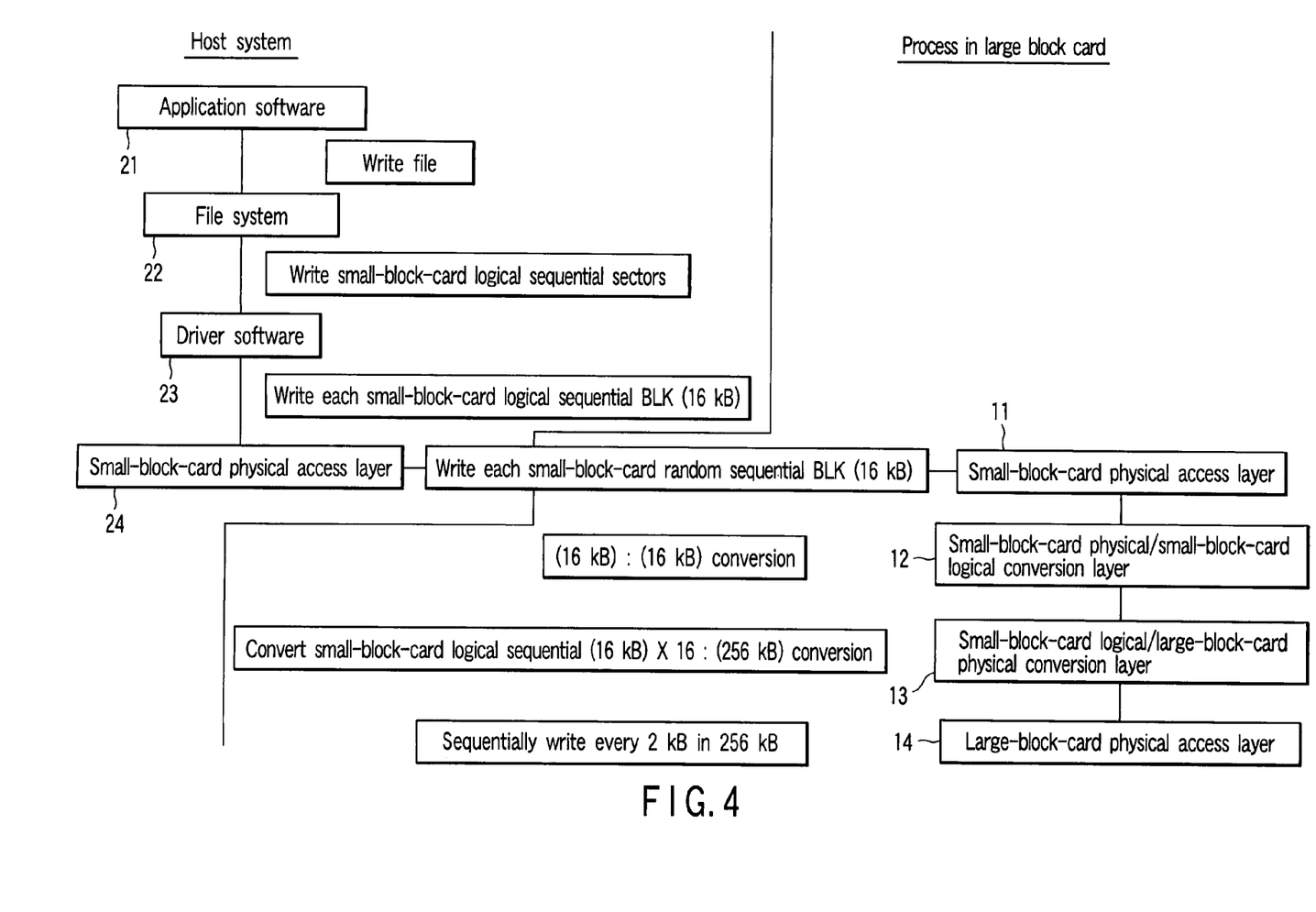
FIG. 4 is a chart showing the communication hierarchy of the host system and of the memory card (large block card)

FIG. 4 is a chart showing the communication hierarchy of the host system and of the memory card (large block card).

The host 20 system has application software 21, a file system 22, driver software 23, and a small-block-card physical access layer 24. On the other hand, the memory card 1 (large block card) has a small-block-card physical access layer 11, a small-block-card physical/small-block-card logical conversion layer 12, a small-block-card logical/large-block-card physical conversion layer 13, and a large-card-block physical access layer 14.

For example, the application software 21 in the host 20 requests the file system 22 to write a file in the memory. Then, the file system 22 instructs the driver software 23 on sequential sector writes on the basis of logical block addresses in the small block card. Upon receiving the instruction, the driver software 23 carries out logical/physical block conversions in order to sequentially write data, that is, one 16-Kbyte block at a time, on the basis of logical block addresses of the small block card. The driver software 23 then issues a random write command based on physical block addresses of the small block card, to the large block card through the small-block-card physical access layer 24. The driver software 23 then executes a data transfer.

For both small and large block cards, a write access is premised on the transmission of a (1) command, a (2) page address (row address), a (3) column address, (4) data, and a (5) program confirmation command in this order in accordance with an appropriate protocol.

Upon receiving a write command with logical block addresses of the small block card from the host 20, the small-block-card physical access layer 11 in the large block card acquires not only the physical block addresses and data but also logical block addresses contained in accompanying data.

The small-block-card physical/small-block-card logical conversion layer 12 has a first table used for a data read or the like to convert physical block addresses (each corresponding to 16-Kbyte block) of the small block card into logical block addresses (each corresponding to 16-Kbyte block) of the small block card. When the small-block-card physical access layer 11 receives a write command to acquire logical block addresses of the small block card, the conversion layer 12 reflects the logical block addresses in the first table. The conversion layer 12 also reflects physical block addresses in the first table.

The small-block-card logical/large-block-card physical conversion layer 13 has a second table used for a data read or the like to convert logical block addresses (each corresponding to sequential 16-Kbyte block×16) of the small block card into physical block addresses (each corresponding to 256-Kbyte physical block) of the large block card. When the small-block-card physical access layer 11 receives a write command to acquire logical block addresses of the small block card, the conversion layer 12 reflects the logical block addresses in the second table.

On the basis of the logical block addresses acquired by the small-block-card physical access layer 11 upon receiving the write command, the large-block-card physical access layer 14 determines how the data is arranged inside the flash memory 3. The large-block-card physical access layer 14 then sequentially writes 16 Kbytes of data in a 256-Kbyte physical block the memory by writing 2 Kbytes (one page) of data during each operation. The large-block-card physical access layer 14 stores the logical and physical block addresses of the small block card which have been acquired, in a predetermined area within a managed data area inside the flash memory 3.

The host 20 thus issues a command based on physical block addresses of the small block card. Accordingly, the large block card carries out management so as to make it possible to determine which 256-Kbyte physical block contains data corresponding to certain physical block addresses of the small block card. Specifically, the large block card manages the correspondences between logical block addresses and physical block addresses for every 16-Kbyte block. The large block card also carries out management so as to make it possible to determine which 256-Kbyte physical block in the large block card contains data corresponding to a 256-Kbyte block of consecutive logical block addresses of the small block card.

Figure 5A:
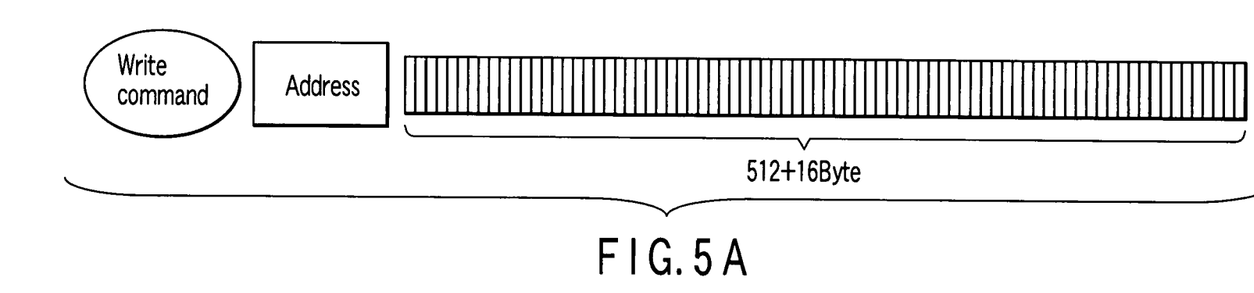
FIGS. 5A and 5B are diagrams showing the format of a command sent by the host.
Figure 5B:
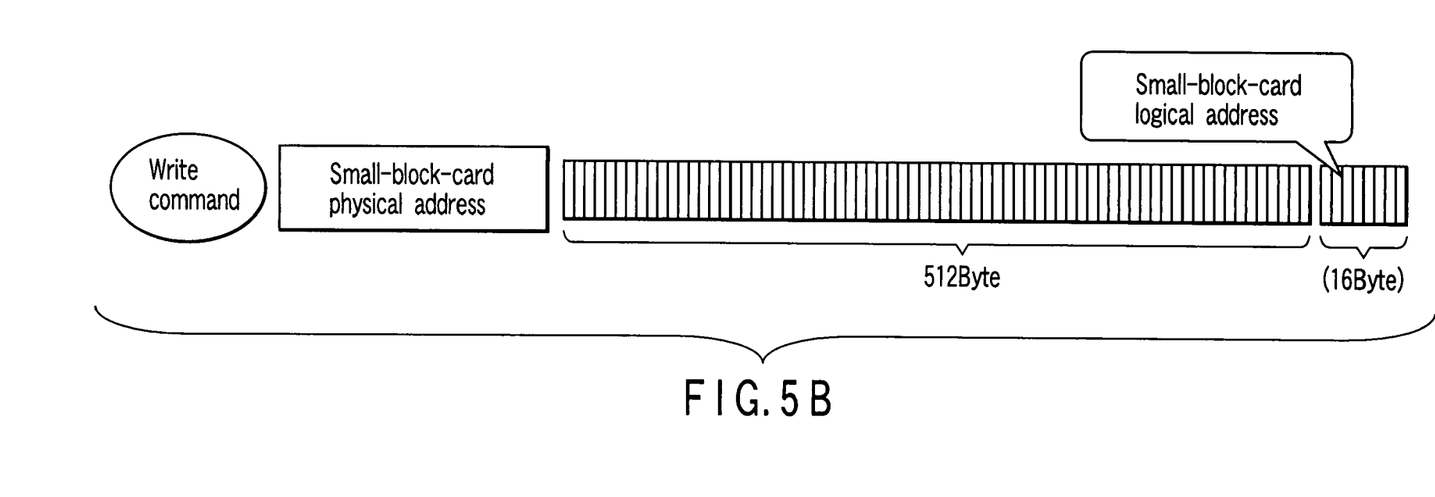

FIGS. 5A and 5B are diagrams showing the format of a command sent by the host 20.

A packet for a command sent by the host 20 contains various pieces of information such as command type information (in this case, "write"), addresses (physical block addresses), and data (actual data such as contents and accompanying data (512 bytes+16 bytes)) as shown in FIG. 5A.

In a packet in this format, "logical block addresses" (logical addresses corresponding to a 16-byte block to be accessed) of the small block card are arranged at a predetermined location in the accompanying data as shown in FIG. 5B. The large block card acquires not only the command type information, physical block addresses, and data but also the "logical block addresses". The "logical block addresses" are not added for a read command.

Figure 6:
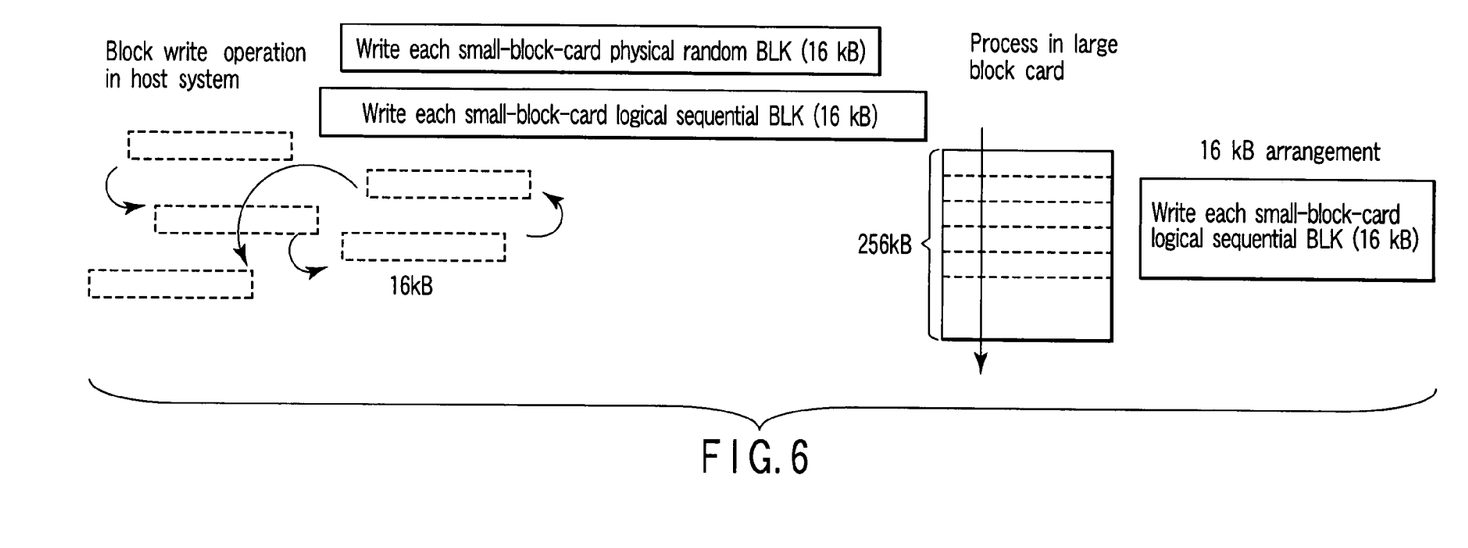
FIG. 6 is a diagram showing a comparison of a block write operation assumed by the host with a write operation actually performed by the memory card (large block card)

FIG. 6 is a diagram showing a comparison of a block write operation assumed by the host with a write operation actually performed by the memory card 1 (large block card).

When a sequential write operation in 16-Kbyte blocks is performed on the basis of logical addresses of the small block card, the host 20 (the left of the figure) performs a random write operation in 16-Kbyte blocks on the basis of physical block addresses of the small block card.

On the other hand, upon receiving a write command from the host 20, the large block card (the right of the figure) sequentially writes every 16 Kbytes of data in the flash memory 3 on the basis of logical block addresses of the small block card.

As previously described, the host 20 performs a random write operation in 16 Kbytes on the basis of physical addresses for small blocks. Such a random write operation involves many processes of rewriting only a part of a large block (256 Kbytes). The NAND flash memory only allows data to be erased in block units. Accordingly, if a block is partly rewritten, it is necessary to write new data to replace the corresponding part of old data, in a new block from which data has already been erased and then copy the remaining data which is not to be rewritten, from the old block containing the old data to be replaced with the new data, to the new block. In this manner, the process of rewriting only a part of a block involves an operation of copying data that is not to be rewritten (this operation will be referred to as an "involved data copy"). Consequently, many processes of rewriting only a part of a block may result in a significant increase in overhead. Thus, in the present embodiment, the large block card reassigns the physical addresses in accordance with the order of the logical addresses obtained from the host 20. This reduces the occurrence of writes to only a part of a block to suppress an increase in overhead.

Figure 7:
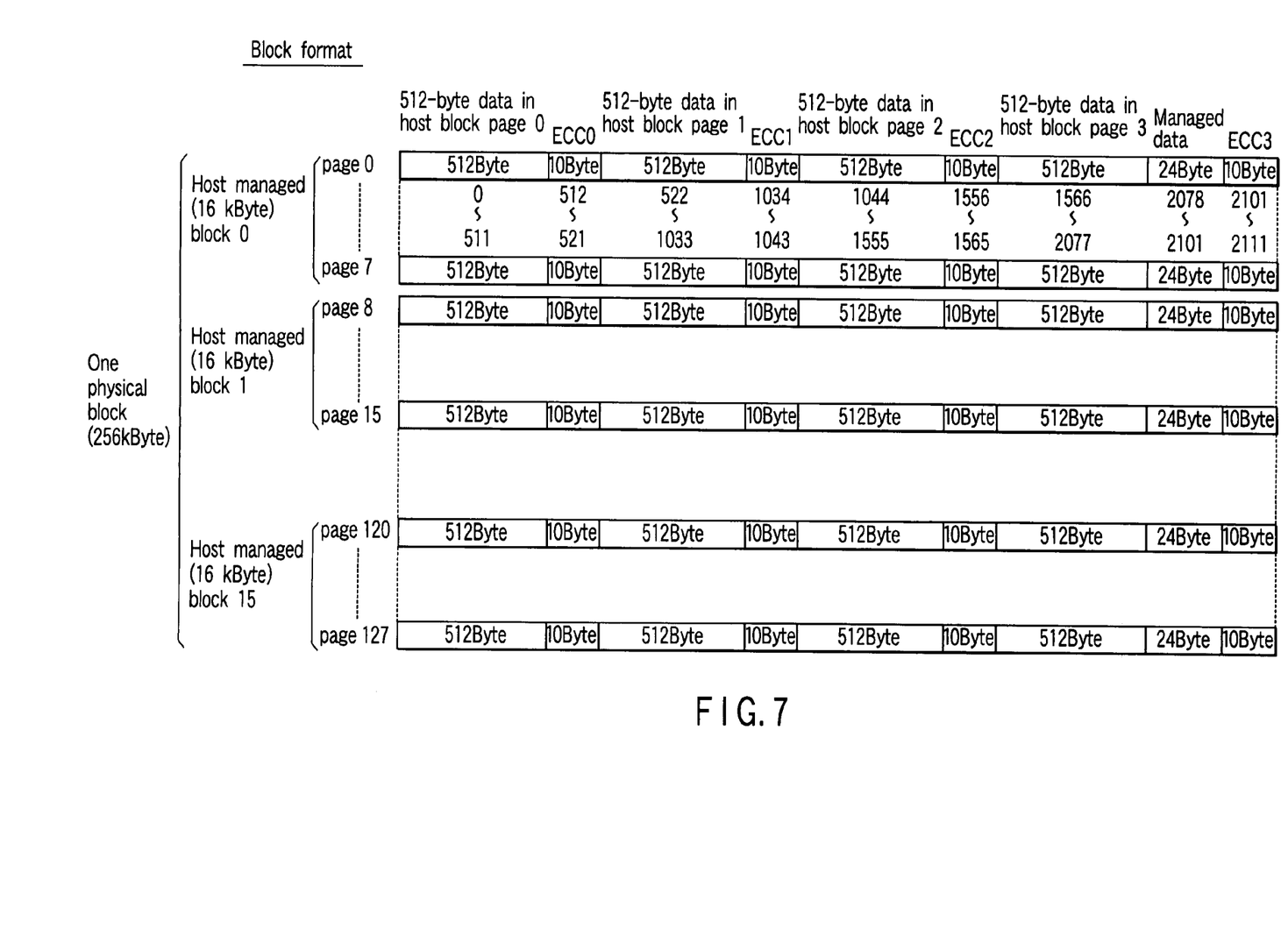
FIG. 7 is a diagram showing the block format of the flash memory in the large block card (for a 256-Kbyte physical block corresponding to an erase unit)

FIG. 7 is a diagram showing the block format of the NAND flash memory 3 in the large block card (for a 256-Kbyte physical block corresponding to an erase unit).

In the large block card, a 256-Kbyte physical block corresponding to an erase unit contains 16 blocks in which data corresponding to 16 Kbytes, corresponding to a unit managed by the host 20, is written (these blocks will hereinafter be referred to as host managed blocks). For a data write, individual data are arranged in the order of the logical block addresses of the small block card.

Each host managed block includes eight pages. Each page contains four 512-byte data areas and 10-byte ECC areas each corresponding to one data area. Further, a 24-byte managed data area is provided after the last (fourth) 512-byte data area in a page. Thus, the last 10-byte ECC area in the page corresponds to both fourth 512-byte data area and 24-byte managed data area.

For example, the last of 128 24-byte managed data areas contained in a 256-Kbyte physical block corresponding to the erase unit stores both address information corresponding to physical block addresses acquired from a command sent by the host 20 (this information will hereinafter referred to as "host managed physical addresses" and address information corresponding to logical block addresses acquired from the command sent by the host 20 (this information will hereinafter referred to as "host managed logical addresses".

The "host managed physical addresses" and "host managed logical block addresses" stored in each 256-Kbyte block are used to create the first table possessed by the small-block-card physical/small-block-card logical conversion layer 12 and the second table possessed by the small-block-card logical/large-block-card physical conversion layer 13 as described in FIG. 4.

Figure 8:
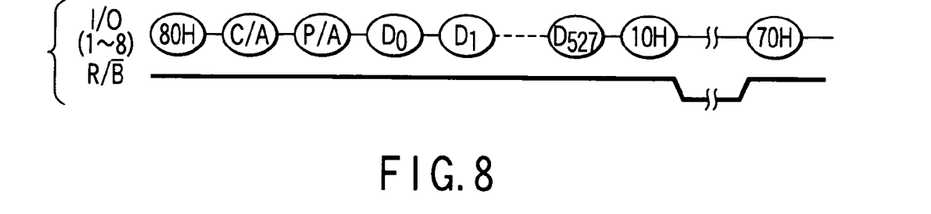
FIG. 8 is a timing chart showing an example of signals to an I/O and R/B pins of the memory card which signals are used when the host executes writes on the memory card according to the present embodiment.

FIG. 8 is a timing chart showing an example of signals to I/O and R/B pins of the memory card which signals are used when the host 20 executes writes on the memory card 1 according to the present embodiment.

The host 20 controls a memory card assuming that the memory card is a nonvolatile memory having a 16-Kbyte erase block size. For example, for a write in the memory card, the host 20 inputs a serial data input command 80H (H denotes a hexadecimal number) to I/O pins 1 to 8. Then, the host 20 inputs a column address C/A and a page address P/A to the I/O pins 1 to 8. The column address C/A and the page address P/A are provided for a virtual physical address space assumed by the host 20 for the memory card 1.

Moreover, the host 20 inputs write data to each of the I/O pins 1 to 8 528 times. Specifically, the host 20 sequentially shifts 528 bits (a total value for all the I/O pins) of data in each of the I/O pins while clocking an input signal to the write enable pin 528 times. Once the data shift-in has been completed, the host 20 inputs a program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready.

However, the status of the R/B pin in FIG. 8 only indicates the status of the memory card 1 to the host 20. That is, in FIG. 8, even when the R/B pin indicates a busy status (that is, outputs a low level) in response to the input of the program command 10H, this does not always indicate that an internal write operation (that is, transfer of data from the page buffer to a memory cell array) is actually being performed on the NAND flash memory 3. Even if the R/B pin returns to the ready status, this does not always indicate that an internal write operation on the NAND flash memory 3 has actually been completed.

Figure 9:
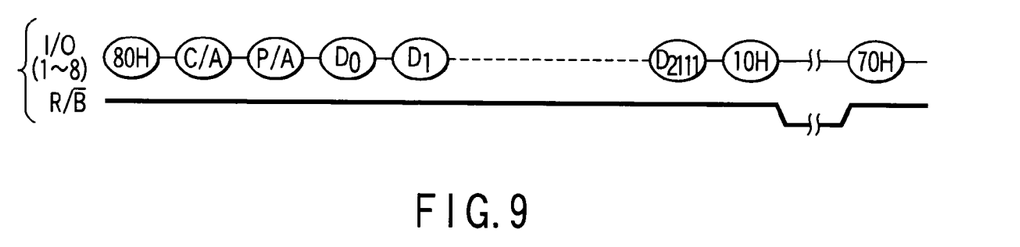
FIG. 9 is a timing chart showing an example of signals for the I/O and R/B pins of a nonvolatile memory in the memory card which signals are used when a controller in the memory card executes writes on the nonvolatile memory in the memory card according to the present embodiment.

FIG. 9 is a timing chart showing an example of signals to the I/O and R/B pins of the NAND flash memory 3 which signals are used when the controller 4 in the memory card 1 executes writes on the NAND flash memory 3 in the memory card 1 according to the present embodiment.

The controller 4 recognizes that the NAND flash memory 3 is nonvolatile and has a 256-Kbyte erase block size. For example, for a write in the NAND flash memory 3, the controller 4 inputs the serial data input command 80H (H denotes a hexadecimal number) to I/O pins 1 to 8. Then, the controller 4 inputs the column address C/A and the page address P/A to the I/O pins 1 to 8. The column address C/A and the page address P/A are provided for a real physical address space assumed by the controller 4 for the NAND flash memory 3. Accordingly, these addresses do not necessarily match the column address C/A and page address P/A in FIG. 8.

Moreover, the controller 4 inputs write data to each of the I/O pins 1 to 8 2,112 times. Specifically, the controller 4 sequentially shifts 2,112 bits (a total value for all the I/O pins) of data in each of the I/O pins while clocking an input signal to the write enable pin 2,112 times. Once the data shift-in has been completed, the controller 4 inputs the program command 10H to the input pins 1 to 8. In response to this, the memory card outputs a low-level signal to the R/B pin to indicate that the memory card is busy. A predetermined time later, the memory card outputs a high-level signal to the R/B pin to indicate that the memory card is ready. The status of the R/B pin in FIG. 9 indicates the actual status of the NAND flash memory 3 to the controller 4.

In FIGS. 8 and 9, previously described, each of the inputs of the column address C/A and page address P/A is shown completed in one cycle. However, the input may require two or more cycles depending on the capacity of the memory card 1 or NAND flash memory 3.

Figure 10:
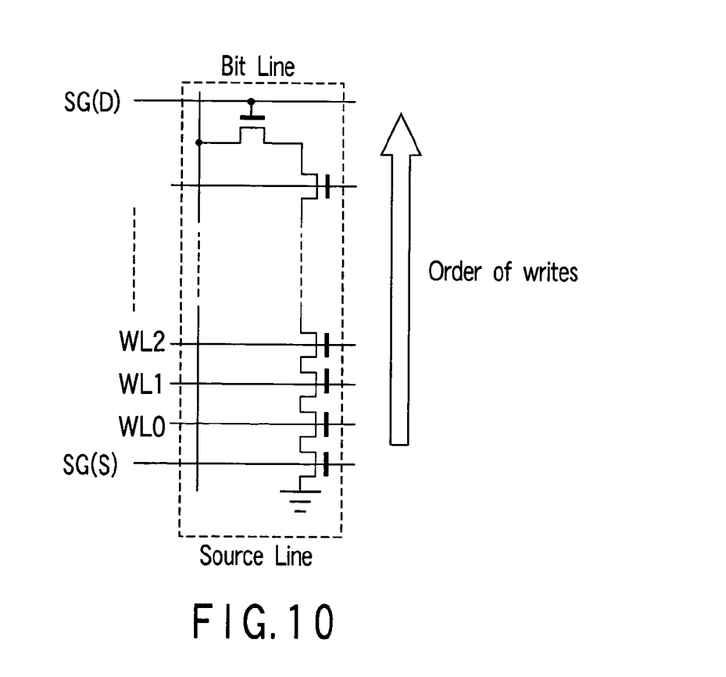
FIG. 10 is a diagram illustrating the order of data writes in a NAND flash memory.

As can be seen in FIGS. 8 and 9, previously described, the time for which the memory card may be busy is restricted. That is, during this time, the controller must write the data and the predetermined time later, it must indicate to the host that the memory card has gotten ready. Further, with the NAND flash memory, when data is written in the pages in a certain physical block, the order of writes is restricted. Specifically, the NAND flash memory is designed so that data must sequentially be written starting with a leading page (corresponding to the cells on the leading word line WL0 illustrated in FIG. 10) in the physical block. In the present embodiment, the technique described later accomplishes efficient data writes while meeting the above individual restrictions.

Now, with reference to FIGS. 11 and 12, description will be given of a basic method of data writes while comparing it with a method of data writes according to the prior art.

In this example, a write operation is performed on block B of the NAND flash memory 3 from which data has already been erased if a request is made that data be written in the ninth area (that is, the "host managed block 8" in FIG. 7 (the area including eight pages)) in block A in which data has already been written, the ninth area being denoted by LBA8. No requests are assumed to be made that data be written in the areas in block A other than the ninth. In this case, the write operation is controlled by the controller 3 (see FIGS. 1 and 2) according to the present embodiment. Specifically, the operation is controlled by the CPU 8, which executes control programs loaded onto the RAM 10 from the ROM 9, and the memory interface section 5.

Figure 11:
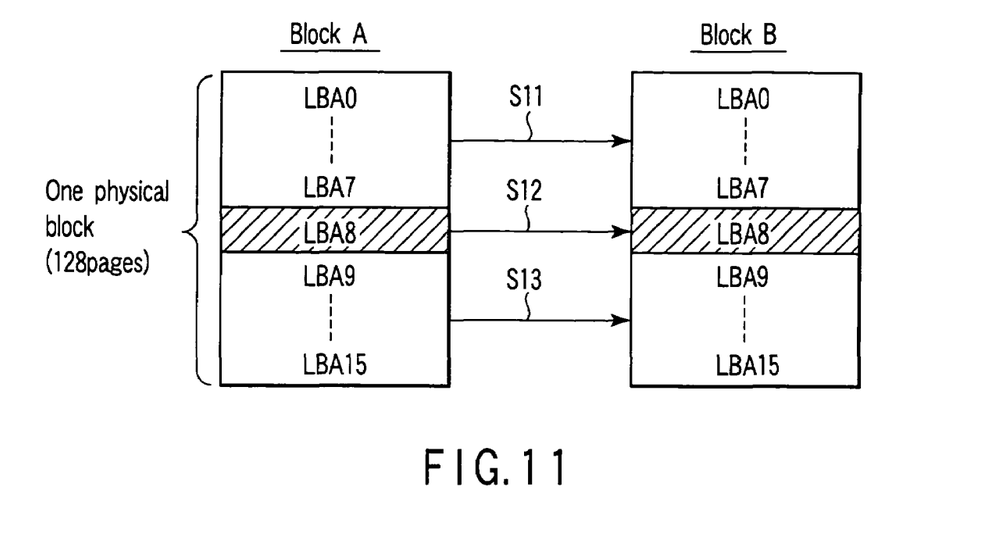
FIG. 11 is a diagram illustrating an example of a method of basic data writes according to the prior art.

With the method of data writes according to the prior art which method is shown in FIG. 11, if a request is made that data be written in the ninth area (LBA8) in block A, the data in the first to eighth areas (LBA0 to LBA7) in block A is copied to the first to eighth areas in block B (step S11).

Subsequently, new data requested to be written in the ninth area (LBA8) in block A is written in the ninth area in block B (step S12).

Finally, the data in the tenth to sixteenth areas (LBA9 to LBA15) in block A is copied to the tenth to sixteenth areas in block B (step S13).

Figure 12:
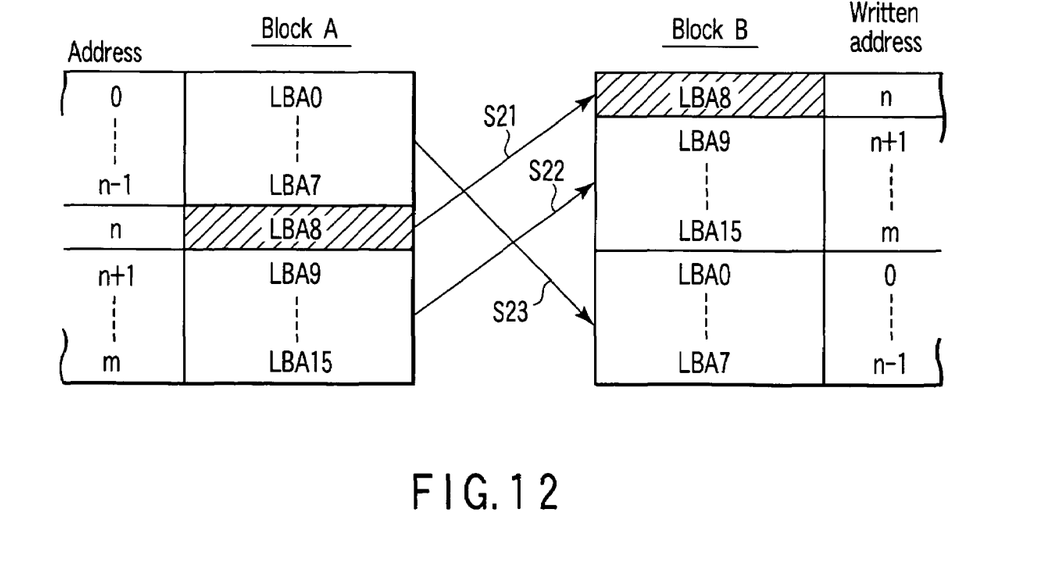
FIG. 12 is a diagram illustrating an example of a method of basic data writes according to the present embodiment.

On the other hand, with the method of data writes according to the present embodiment which method is shown in FIG. 12, if a request is made that data be written in the ninth area (LBA8) in block A, new data requested to be written in the ninth area (LBA8) in block A is first written in the first (leading) area in block B (step S21). At this time, regardless of the value n of the address (for example, a block address or page address) of the area intended for the write request, the new data requested to be written is written in the leading area of block B. Further, the value n of the address is written in the redundant section of the corresponding page.

Subsequently, the data in the tenth to sixteenth areas (LBA9 to LBA15) in block A is copied to the second area, following the leading area, to the eighth areas in block B (step S22). At this time, the values n+1 to m of the addresses are written in the redundant sections of the corresponding pages.

Finally, the data in the first to eighth areas (LBA0 to LBA8) in block A is copied to the ninth to sixteenth areas in block B (step S23). At this time, the values 0 to n-1 of the addresses are written in the redundant sections of the corresponding pages.

Once the data writes in block B have been finished, the data in block A is erased. This erasure may be carried out after the memory card has been indicated to get ready.

By executing the process shown in the steps S21 to S23 every time a data write request is made, it is possible to prevent an increase in time interval between one write and the next write to solve the temporal restriction problem described in the prior art. It is also possible to meet the restriction that data must sequentially be written starting with the leading area in each physical block.

On the other hand, after the process shown in the steps S21 to S23 has been executed, if a request is made that data be read from a certain area in block B, the controller 4 can determine the position at which data to be read is written, on the basis of the address n written in the leading area in block B. In this case, it is possible to calculate to which address in block B the data requested to be read corresponds, on the basis of the address n and the address from which the data is requested to be read.

Now, with reference to FIGS. 13 and 14, description will be given of an example showing a marked difference between the method of data writes according to the present embodiment and the method of data writes according to the prior art.

In this example, a write operation is performed on blocks E and F of the NAND flash memory 3 from which data has already been erased if a request is made that data be written in the leading area in block C in which data has already been written, the leading area being denoted by LBA0, and if a request is made that data be written in the final area in block D which area is denoted by LBA31.

Figure 13:
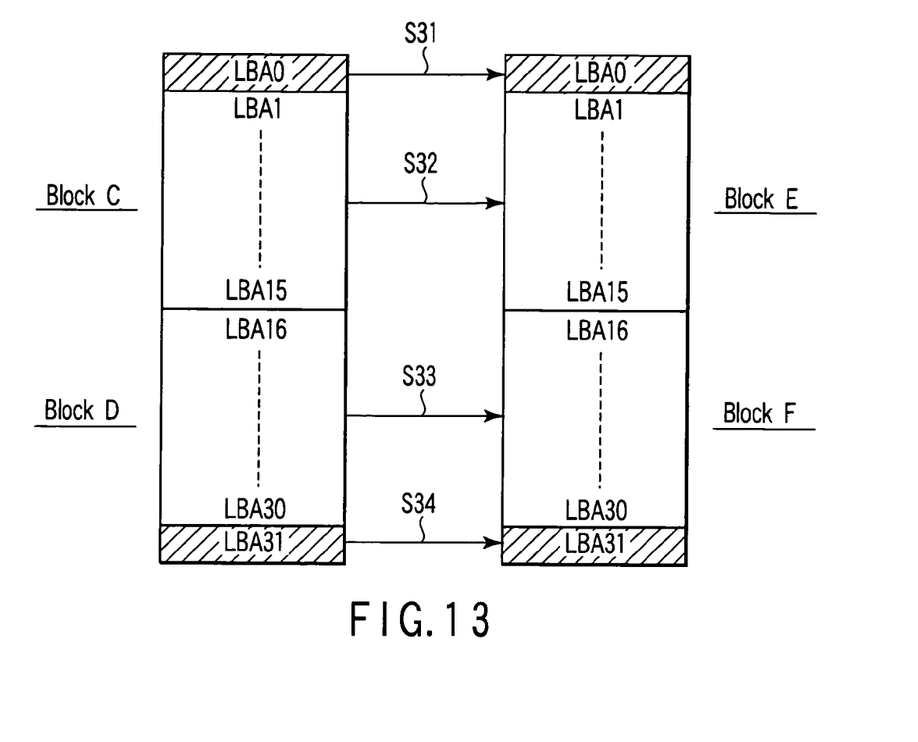
FIG. 13 is a diagram illustrating a specific example of the method of basic data writes according to the prior art.

With the method of data writes according to the prior art which method is shown in FIG. 13, new data requested to be written in the first area (LBA0) in block C is written in the first area in block E (step S31).

Subsequently, the data in the second to sixteenth areas (LBA1 to LBA15) in block C is copied to the second to sixteenth areas in block E (step S32).

Finally, new data requested to be written in the thirty-second area (LBA31) in block D is written in the thirty-second area in block F (step S34).

In this example, there is a very large time interval between the write in the step S31 and the write in the step S34. Consequently, temporal restrictions such as the one described in the prior art may not be met.

Figure 14:
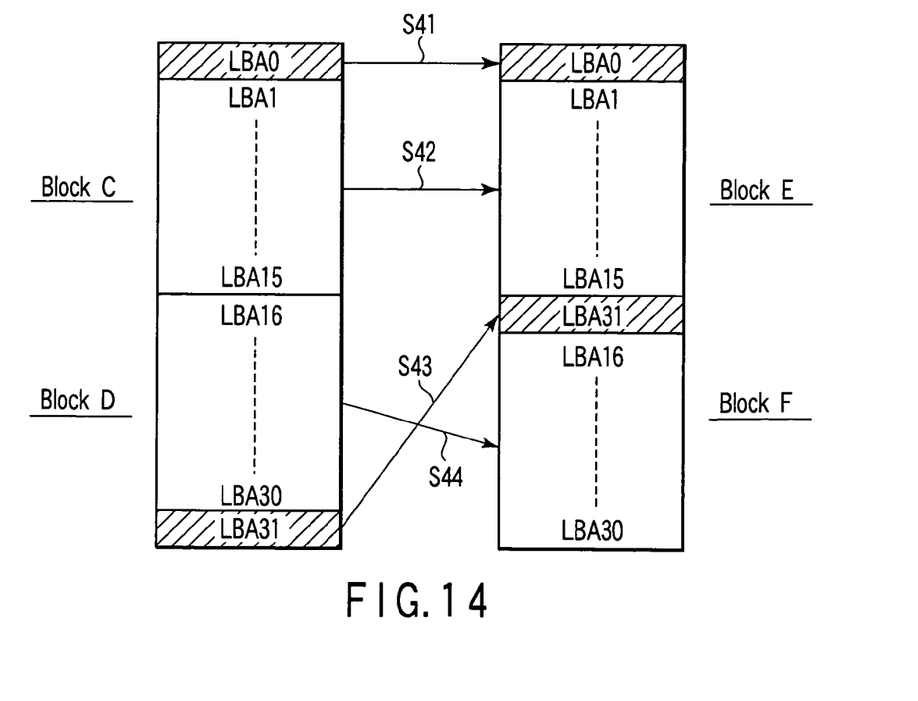
FIG. 14 is a diagram illustrating a specific example of the method of basic data writes according to the present embodiment.

On the other hand, with the method of data writes according to the present embodiment which method is shown in FIG. 14, new data requested to be written in the first area (LBA0) in block C is first written in the first (leading) area in block E (step S41). At this time, regardless of the value of the address of the area intended for the write request, the new data requested to be written is written in the leading area of block E. Further, the value (not shown) of the address is written in the redundant section of the corresponding page.

Subsequently, the data in the second to sixteenth areas (LBA1 to LBA15) in block C is copied to the second to sixteenth areas in block E (step S42). At this time, the values (not shown) of the addresses are written in the redundant sections of the corresponding pages.

Then, new data requested to be written in the sixteenth area (LBA31) in block D is first written in the first (leading) area in block F (step S43). At this time, regardless of the value of the address of the area intended for the write request, the new data requested to be written is written in the leading area of block F. Further, the value (not shown) of the address is written in the redundant section of the corresponding page.

Finally, the data in the first to fifteenth areas (LBA16 to LBA30) in block D is copied to the second to sixteenth areas in block F (step S44). At this time, the values of the addresses are written in the redundant sections of the corresponding pages.

Once the data writes in block E have been finished, the data in block C is erased. Likewise, once the data writes in block F have been finished, the data in block D is erased. These erasures may be carried out at a time. Further, these erasures may be carried out after the memory card has been indicated to be ready.

As can be seen in the example shown in FIG. 14, compared to FIG. 13, the time interval between the write in the step S41 and the write in the step S43 can be reduced. The temporal restriction relating to writes can be met.

In the above description, the example is shown in which the process proceeds in the order of the steps S41, S42, S43, and S44. Alternatively, the process may proceed in the order of the steps S41, S43, S42, and S44. Specifically, after new data has been written in the leading area of block E, new data may be written in the leading area of block F. Then, data may be copied to the remaining areas of block E. Finally, data may be copied to the remaining areas of block F. Also in this case, it is possible to meet the restriction that data must sequentially be written starting with the leading area in each physical block.

Further, in the illustrated example, the methods of data writes in FIGS. 12 and 14 are intended for the large block card. However, these methods may be intended for the small block card. In this case, each LBA in the figures may be considered to be a page.

Thus, the present embodiment enables a reduction in the time interval between one write and the next write. This makes it possible to accomplish write operations that meet the temporal and other restrictions described in, for example, the specification of the memory card.

In the description of the above embodiment, the example is shown in which the controller 4 controls reads and writes of data from and in the semiconductor memory actually used (also controls the processes shown in FIGS. 12 and 14). Alternatively, for example, the driver software 23 of the host 20 may execute this control. In this case, the host 20 may, for example, manage the association of the addresses of the semiconductor memory assumed by the host 20 with the addresses of the semiconductor memory actually used.

Furthermore, in the above embodiment, the erase block size of the flash memory 3 actually used is larger than that of the flash memory assumed by the host 20. However, of course, the erase block size of the flash memory 3 actually used may be the same as that of the flash memory assumed by the host 20.

Furthermore, in the above embodiment, the NAND flash memory is described as an example of the nonvolatile memory. However, the nonvolatile memory is not limited to the NAND flash memory but other types of memories are applicable.

As described above in detail, the present invention can accomplish operations that meet the temporal restriction on writes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device which controls a semiconductor memory having a predetermined erase block size, comprising:
   a controller configured to operate, if a write request of first data is made with respect to an address identical to an address of data which has already been written in a certain area in a first block, to write the first data in a leading area in a second block, regardless of an address of the certain area in the first block,
   the controller being configured to operate to write second data in a first area next to the leading area in the second block, wherein the first data and the second data have consecutive addresses.

2. The semiconductor device according to claim 1, wherein the controller writes the address of the first data together with the first data, in the leading area in the second block.

3. The semiconductor device according to claim 2, wherein if a data read request is made with respect to the address identical to the address of the data which has been written in the certain area in the second block, the controller determines a position at which data to be read is written, on the basis of the address written together with the first data in the leading area in the second block.

4. The semiconductor device according to claim 1, wherein if no data write request is made with respect to an address identical to an address of data in other areas in the first block, the controller copies the data in the first block other than the data in the certain area, to areas in the second block other than the leading area.

5. The semiconductor device according to claim 1, wherein:
   the controller is configured to manage association of addresses of blocks in the semiconductor memory with addresses of data; and
   the address of the second data is associated with an address of the second block.

6. The semiconductor device according to 5, wherein:
   the controller is configured to write, in a second area in the second block, third data whose address has the highest number among addresses to be associated with the address of the second block; and
   the controller is configured to write, in a third area next to the second area in the second block, fourth data whose address has the lowest number among the addresses to be associated with the address of the second block.

7. A memory card comprising:
   a nonvolatile semiconductor memory having a predetermined erase block size; and
   a controller configured to operate, if a write request of first data is made with respect to an address identical to an address of data which has already been written in a certain area in a first block, to write the first data in a leading area in a second block, regardless of an address of the certain area in the first block,
   the controller being configured to operate to write second data in a first area next to the leading area in the second block, wherein the first data and the second data have consecutive addresses.

8. The memory card according to claim 7, wherein the controller includes:
   a ROM which stores a program for an operation of the controller; and
   a CPU which executes the program stored in the ROM.

9. The memory card according to claim 7, wherein the nonvolatile semiconductor memory is a NAND flash memory.

10. The memory card according to claim 7, wherein the nonvolatile semiconductor memory has a design rule of less than 0.1 µm.

11. The memory card according to claim 7, wherein the nonvolatile semiconductor memory has a storage capacity of at least 1 Gbits.

12. A semiconductor device comprising:
   a controller which accesses a semiconductor memory having a first erase block size,
   the controller being configured to manage association of a first address in the semiconductor memory having the first erase block size with a second address in a semiconductor memory having a second erase block size smaller than the first erase block size, the controller being configured to operate, if a write request of first data is made with respect to an address identical to an address of data which has already been written in a certain area corresponding to the second erase block size in a first block, to write the first data in a leading area in a second block, regardless of an address of the certain area in the first block, and the controller being configured to operate to write second data in a first area next to the leading area in the second block, wherein the first data and the second data have consecutive addresses.

13. The semiconductor device according to claim 12, wherein if no data write request is made with respect to an address identical to an address of data in other areas in the first block, the controller copies the data in the first block other than the data in the certain area, to the areas in the second block other than the leading area, in which the copied data and the data in the leading area have consecutive logical block addresses.

14. A method of controlling a semiconductor memory having a predetermined erase block size, comprising:

receiving a write request of first data with respect to an address identical to an address of data which has already been written in a certain area in a first block;

writing the first data in a leading area in a second block, regardless of an address of the certain area in the first block; and writing second data in a first area next to the leading area in the second block, wherein the first data and the second data have consecutive addresses.

15. The method of controlling a semiconductor memory according to claim 14, wherein the address of the first data is written together with the first data, in the leading area in the second block.

16. The method of controlling a semiconductor memory according to claim 15, wherein if a data read request is made with respect to the address identical to the address of the data which has been written in the certain area in the second block, a position at which data to be read is written is determined on the basis of the address written together with the first data in the leading area in the second block.

17. The method of controlling a semiconductor memory according to claim 14, wherein if no data write request is made with respect to an address identical to an address of data in other areas in the first block, the data in the first block other than the data in the certain area is copied to areas in the second block other than the leading area.

18. A method of controlling a semiconductor memory having a first erase block size, comprising:

managing association of a first address in the semiconductor memory having the first erase block size with a second address in a semiconductor memory having a second erase block size smaller than the first erase block size;

operating, if a write request of first data is made with respect to an address identical to an address of data which has already been written in a certain area corresponding to the second erase block size in a first block, to write the first data in a leading area in a second block, regardless of an address of the certain area in the first block; and operating to write second data in a first area next to the leading area in the second block, wherein the first data and the second data have consecutive addresses.

* * * * *